United States Patent [19]
Pelgrom

[11] Patent Number: 4,695,753
[45] Date of Patent: Sep. 22, 1987

[54] CHARGE SENSOR HAVING A PRESET FLIPFLOP

[75] Inventor: Marcellinus J. M. Pelgrom, Eindhoven, Netherlands

[73] Assignee: U.S. Philips Corporation, New York, N.Y.

[21] Appl. No.: 910,247

[22] Filed: Sep. 18, 1986

Related U.S. Application Data

[63] Continuation of Ser. No. 698,007, Feb. 4, 1985, abandoned.

[30] Foreign Application Priority Data

Feb. 13, 1984 [NL] Netherlands .......................... 8400453

[51] Int. Cl.$^4$ .............................................. H03K 3/45
[52] U.S. Cl. .................................... 307/530; 307/355; 307/362; 365/205; 365/208; 377/60
[58] Field of Search ........................ 307/530, 355, 362; 365/205, 207, 208; 377/60, 58

[56] References Cited

U.S. PATENT DOCUMENTS

| | | | |
|---|---|---|---|
| 3,983,413 | 9/1976 | Gunsagar et al. | 377/58 X |
| 3,989,955 | 11/1976 | Suzuki | 307/481 X |
| 4,024,512 | 5/1977 | Amelio et al. | 307/530 X |
| 4,181,865 | 1/1980 | Kohyama | 307/530 |
| 4,277,702 | 7/1981 | Hamilton et al. | 307/530 X |
| 4,280,067 | 7/1981 | Kohyama | 307/530 X |
| 4,354,257 | 10/1982 | Varshney et al. | 307/530 X |
| 4,376,987 | 3/1983 | Hsia | 307/530 X |

OTHER PUBLICATIONS

Aaron, "Sense Amplifier for Small Bucket-Brigade Charge Signal", *IBM-TDB;* vol. 19, No. 5, pp. 1768–1769; 10/1976.
Cassidy et al, "Small Charge Sense Latch"; *IBM-TDB;* vol. 20, No. 1, pp. 268–269; 6/1977.
Amelio, "Device Design for CCD Digital Memory"; CCD-76; 3rd Int'l Conf.; 9/1976.

*Primary Examiner*—Stanley D. Miller
*Assistant Examiner*—D. R. Hudspeth
*Attorney, Agent, or Firm*—Robert T. Mayer; Steven R. Biren

[57] ABSTRACT

The invention relates to a charge detector, more particularly for reading binary information in a CTD. The detector includes a flipflop having two cross-coupled MOS transistors and two MOS transistors acting as loads. The signal to be read and the reference signal are supplied to the gates of the loads. The junctions between the driver transistors and the loads are connected to reset transistors. The drains of the loads are applied to a (fixed) supply voltage and the sources of the driver transistors are applied via a switching transistor to the supply voltage return. The circuit arrangement is operated so that before the activation of the flipflop the said junctions are set to a signal-dependent preadjustment. When the switching transistor is then energized, the flipflop will be in the correct stage with a higher degree of reliability and without being influenced by clock cross-talk.

1 Claim, 3 Drawing Figures a b

CHARGE SENSOR HAVING A PRESET FLIPFLOP

This is a continuation of application Ser. No. 698,007, filed Feb. 4, 1985, now abandoned.

BACKGROUND OF THE INVENTION

The invention relates to a charge sensor, more particularly for a charge transfer device, which includes two cross-coupled MOS transistors $T_1$ and $T_2$ each having a source, a drain and a gate, the gate of $T_2$, and the drain of $T_1$ being connected to a first junction $A_1$ and the gate of $T_1$ and the drain of $T_2$ being connected to a second junction $A_2$, while the sources of $T_1$ and $T_2$ are connected to a third junction $A_3$. The charge sensor also includes two load MOS transistors $T_3$ and $T_4$, each having a source, a drain and a gate, the sources of $T_3$ and $T_4$ being connected to $A_1$ and $A_2$, respectively, aand the drains of $T_3$ and $T_4$ being connected to a fourth junction $A_4$, while the gates of $T_3$ and $T_4$ are coupled to signal supply means.

A positive and a negative current supply lead are provided for passing a current between the junction $A_3$ and $A_4$, and a fifth MOS transistor $T_5$ is provided which acts as a switch and has a gate which is connected to a clock voltage source for applying the clock voltage for the intermittent energization of the sensor.

A sixth and a seventh MOS transistor each having a source, a drain and a gate are also provided, the drain of $T_6$ being connected to $A_1$ and the drain of $T_7$ being connected to $A_2$, while the sources are connected to the current supply lead associated with $A_3$ and the gates are connected to a clock voltage source for intermittently opening and closing the transistors $T_6$ and $T_7$.

The invention further relates to a charge transfer device which is provided with such a charge sensor.

It should be noted that in the following description a transistor is considered to be closed when it is in a conductive state and is considered to be opened when it is in a non-conductive state. The transistors $T_1$-$T_4$ constitute a flipflop circuit with the transistors $T_1$ and $T_2$ as driver trabsistors and the transistors $T_3$ and $T_4$ as loads. The transistor $T_5$ serves to energize the flipflop when new signal charges to be read are supplied. The transistors $T_6$ and $T_7$ serve to reset the junctions $A_1$ and $A_2$ after reading. The output signals can be derived at the junctions $A_1$ and $A_2$.

A circuit arrangement of the kind mentioned above is particularly suitable for reading information in a CCD storage, in which the digital information stored in the storage can be applied to one input gate and a reference level halfway between the "0" level and the "1" level can be applied to the other input gate. Such a charge sensor is described inter alia in U.S. Pat. No. 3,983,413 of Gunsager et al. In this known circuit arrangement, the junction $A_3$, i.e. the sources of the driver transistors, is applied to a fixed potential, i.e. the earth, while the junction $A_4$, i.e. the drains of the load transitors, is connected to the positive supply through the aforementioned switching transistor $T_5$. Another prior art circuit is shown in IEEE JSSC, Vol. SC-12, No. 4, August 1977, pp. 335–343.

In a known circuit arrangement having a configuration as shown in Gunsager, during operation a number of problems may arise, which adversely affect the reliability of the sensor. Due to the fact that the switching transistors $T_5$ is connected to the load transistors $T_3$ and $T_4$, the transistors $T_3$ and $T_4$ each time have to be raised from 0 V to the high supply voltage (for example 5 V). Due to capacitive couplings, the gates of $T_3$ and $T_4$ and hence also the output zones of CCD channels connected to these gates, will perform a corresponding voltage jump. A second problem resides in the control of the load transistors $T_3$ and $T_4$. The voltage by which their conduction is determined at the instant of activation depends inter alia upon the supply voltage, the transistor threshold voltage, the signal charge and cross-talk voltages. Due to the fact that in general the conduction in these transistors is high, the conduction difference is comparatively small, as a result of which the aforementioned varying conditions can seriously and adversely affect the reliability of the circuit arrangement.

SUMMARY OF THE INVENTION

The invention has inter alia for its object to provide a charge sensor in which the aforementioned disadvantages are eliminated at least to a considerable extent. For this purpose according to the invention a charge sensor of the kind mentioned above is characterized in that the drain of $T_5$ is connected to the junction $A_3$ and the source of $T_5$ is connected to the supply lead associated with $A_3$ and in that the gates of $T_5$, $T_6$ and $T_7$ are connected to a clock voltage source which supplies clock voltages in a manner such that at the beginning of each cycle the junctions $A_1$ and $A_2$ are first adjusted to a reset voltage by closing the transistors $T_6$ and $T_7$ after which while $T_5$ is opened, $T_6$ and $T_7$ are also opened and the signal charges to be read are applied to the gates of $T_3$ and $T_4$, as a result of which a signal-dependent voltage difference is obtained between the junctions $A_1$ and $A_2$, whereupon the transistor $T_5$ is closed, while the said voltage difference is increased.

In this circuit arrangement, during operation the drains of the load transistors $T_3$ and $T_4$ can be applied to a fixed potential (supply lead), as a result of which clock cross-talk via these transistors to the CCD line is avoided. Due to the fact that the switching transistor $T_5$ is connected to the sources of the driver transistors of the flip-flop, it is further possible to ensure that no current flows through the flipflop, whereas current can flow through the circuits $T_3$-$T_6$ and $T_4$-$T_7$. As will appear from the description of the Figures, this fact is utilized to give the flipflop a signal-dependent preadjustment before it is activated, as a result of which it passes to the correct state with greater certainty upon energization.

BRIEF DESCRIPTION OF THE DRAWING

The invention will be described more fully with reference to an embodiment and the accompanying diagrammatic drawing, in which.

DESCRIPTION OF THE PREFERRED EMBODIMENT

Figure 1:
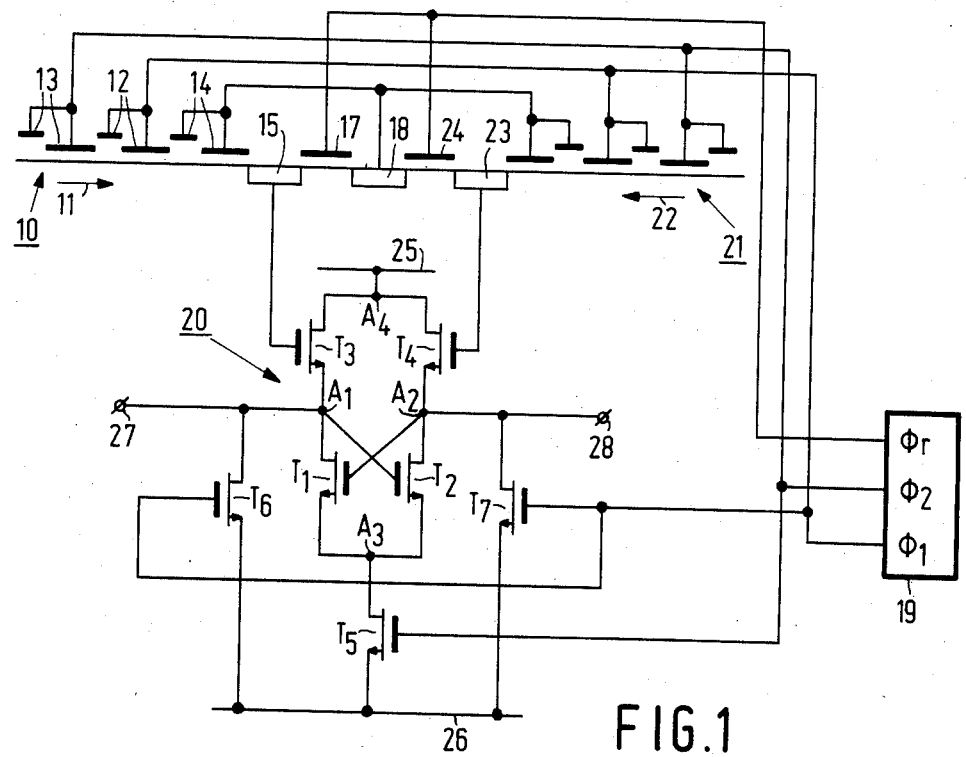
FIG. 1 shows a circuit diagram of a charge sensor according to the invention.

FIG. 1 shows a circuit diagram of a charge sensor 20 according to the invention together with the output stage—indicated only diagrammatically—of a CCD. This output stage forms part, for example, of a storage in which logic "ones" and "zeroes" are stored in the form of electric charge, which is shifted through the CCD channel, of which the last part 10 is shown in FIG. 1. The information moves in the direction indicated by the arrow 11 from the lefthand to the righthand side. It is assumed that the charge-coupled device comprises a 2-phase n-type channel in which the charge is stored as electron packets. The clock electrodes 12 and 13 which are driven by $\phi_1$ and $\phi_2$ have a transfer part on thicker oxide and a storage part on thinner oxide. The last electrode 12 is followed by a gate 14, which is applied to a fixed potential at, for example, the high level of $\phi_1$ (5 V). This gate prevents crosstalk from the clock electrodes 13,14 to the output 15. This output consists of an n-type zone which is connected to an input of the charge sensor 20. Via a MOS transistors comprising the gate 17 and the n-type zone 18 applied to a fixed potential, for example 5 V, the zone 15 can be reset. The gate 17 is driven by the clock voltage $\phi_r$. The clocks $\phi_1\phi_2$ and $\phi_r$ are supplied by clock voltage sources, which are indicated by a block 19 in FIG. 1 for the sake of simplicity.

Besides the channel 10, the output part 21 of a reference CCD is also shown, whose construction is identical to that of the part 10, on the understanding that the charge transport takes place in the direction indicated by the arrow 22 from the righthand to the lefthand side. Via the channel 21 charge packets are transported, whose value lies halfway between the "ones" and "zeroes" transported through the channel 10. For the sake of clarity, this reference level is further designated by "$\frac{1}{2}$". These signals are also transported under the influence of the clocks $\phi_1$ and $\phi_2$ to the output zone 23 in phase with the charge packets in the channel 10. The output zone 23 is coupled to a second input of the amplifier 20. The zone 23 is reset via an adjoining transistor, which has the zone 18 as a drain and has the layer 24 as a gate. The gates 27 and 24 are both driven by the clock voltage $\phi_r$. The amplifier 20 comprises a flipflop circuit which is composed of n-channel field effect transistors, which can be provided together with the charge-coupled device in a common semiconductor body. In the drawing, the sources of the transistors are indicated by an arrow.

The flipflop comprises a first and a second transistor $T_1$ and $T_2$, which act as drive transistors. The gate of $T_2$ and the drain of $T_1$ are connected to a first junction $A_1$, while the gate of $T_1$ and the drain of $T_2$ are connected to a second junction $A_2$. The sources of $T_1$ and $T_2$ are connected to a third junction $A_3$. The flipflop further comprises a third and a fourth transistor $T_3$ and $T_4$, which act as load elements and whose sources are connected to $A_1$ and $A_2$, respectively. The drains of $T_3$ and $T_4$ are connected to a fourth junction $A_4$, which can be applied via a supply lead 25 to a fixed voltage, more particularly 5 V. The gates of $T_3$ and $T_4$ are connected to the zones 15 and 23 and serve as inputs for the signals to be detected.

The junction $A_3$ is connected to the drain of a fifth transistor $T_5$, which acts as a switching transistor. The source of $T_5$ is connected to the negative supply lead 26 (for example ground) and the gate is connected to the clock voltage source 19 for applying the clock voltage $\phi_2$, as a resulting of which the current through the flipflop can alternately be switched on and off under the influence of the clock $\phi_2$. The junction $A_1$ and $A_2$ can be reset by means of the transistors $T_6$ and $T_7$, whose drains are connected to the junctions $A_1$ and $A_2$, respectively. The sources of $T_6$ and $T_7$ are connected to a reference voltage, for example to ground. The gates of $T_6$ and $T_7$ are connected to the clock voltage source 19 for applying the clock voltage $\phi_1$. The (complementary) output signals can be derived at the output terminals 27 and 28, which are connected to $A_1$ and $A_2$, respectively.

Figure 2:
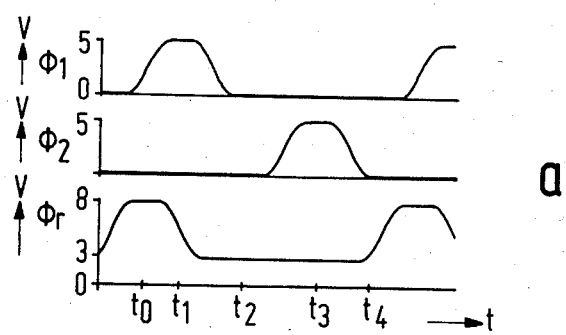
FIGS. 2a and 2b show voltage diagrams of various points of this circuit arrangement.
Figure 2:
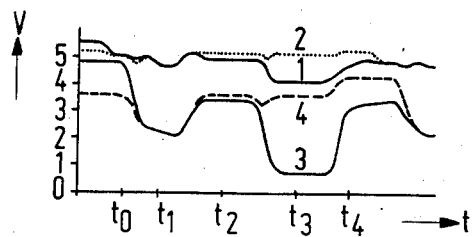

FIG. 2a shows the clocks $\phi_1$, $\phi_2$ and $\phi_r$ as a function of the time t. It is important in connection with the operation of the charge sensor 20 that the clocks $\phi_1$ and $\phi_2$ do not overlap each other so that the transistors $T_5$ and $T_6/T_7$ are not closed simultaneously. In the case of such not-overlapping clock voltages, the charge-coupled device is operated in the so-called "drop clock" mode, as is described inter alia in the chapter "Application of CCD's to Memories", in particular pages 213/217 of the book "Charge-Coupled Devices and Systems", Ed. M. J. Howes and D. V. Morgan. At the instant $t_1$, $\phi_1$ is at 5 V. Signal charge which was stored at $\phi_1$ under the electrode 13 is now transferred to the semiconductor region under the electrode 12. At $t_2$, $\phi_1$ is again at 5 V. The signal charge is then transferred via the electrode 14 (constantly 5 V) to the zone 15, which had been reset before (at $t_o$) to 5 V via transistor 17,18. At the same time, a reference charge "$\frac{1}{2}$" is stored in the zone 23. As $\phi_1 = 5$ V ($t_1$), the transistors $T_6$ and $T_7$ are closed, while the switch $T_5$ is opened, as a result of which the points $A_1$ and $A_2$ are at substantially the same voltage. This is illustrated in FIG. 2b, in which the curves ① and ② represent the potential of the zones 15 and 23 and of the gates of $T_3$ and $T_4$ for a logic "1" and the signal charge "$\frac{1}{2}$", respectively, while the curves ③ and ④ represent the associated potentials at the points $A_1$ and $A_2$. When $\phi_1$ returns to 0 V, the switches $T_6$ and $T_7$ are opened. The points $A_1$ and $A_2$ rise to the voltage of the supply lead 25 and remain by about a threshold voltage below 5 V with respect to the associated gate electrode. Due to the fact that between the gates of $T_3$ and $T_4$ a signal-dependent voltage difference is applied, the points $A_1$ and $A_2$ will be given a signal-dependent preadjustment or preset while the flipflop is not yet activated by $\phi_2$, as is represented by the curves ③ and ④ at $t_2$. When now ($t_3$) the switch $T_5$ is energized by $\phi_2$, as a result of which the flipflop is activated, the voltage difference between the points $A_1$ and $A_2$ is increased to substantially the complete supply voltage. The state occupied by the flipflop upon activation is already defined by the voltage difference between $A_1$ and $A_2$ preset at the instant $t_2$. The possibility that the flipflop will occupy the wrong state due to cross-talk of clocks is thus substantially eliminated.

At a subsequent stage, the flipflop is deactivated again when $\phi_2$ returns to zero and hence the switch $T_5$ is opened. The reset clock $\phi_r$ passes to 8 V, as a result of which the transistors 15,17,18 and 23,24,18 become conducting and the zones 15,23 and the gates of $T_3$ and $T_4$ are reset to 5 V and a new cycle can start.

It will be appreciated that the invention is not limited to the above embodiment, but that many other variations are possible for those skilled in the art without departing from the scope of the invention. For example, the charge-coupled device may be of the surface channel type as well as of the buried channel type. In addition to n-channel devices, the invention may also be used in p-type devices. The representation at the points $A_1$ and $A_2$ may also be obtained with or by means of a source follower action, the tranistors $T_6$ and $T_7$ still being (partly) closed in the presence of new information at the gates of $T_3$ and $T_4$, while $T_5$ is opened.

What is claimed is:

1. A charge sensor, for use with a charge transfer device comprising:

two cross-coupled MOS transistors $T_1$ and $T_2$ each having a source, a drain and a gate, the gate of $T_2$ and the drain of $T_1$ being connected to a first junction $A_1$ and the gate of $T_1$ and the drain of $T_2$ being connected to a second junction $A_2$, while the sources of $T_1$ and $T_2$ are connected to a third junction $A_3$;

two load MOS transistors $T_3$ and $T_4$ each having a source, a drain and a gate, the sources of $T_3$ and $T_4$ being directly and continuously connected to $A_1$ and $A_2$, respectively, and the drains of $T_3$ and $T_4$ being directly and continuously connected to a fourth junction $A_4$, while the gates of $T_3$ and $T_4$ are coupled to a signal supply means;

a positive and negative current supply lead for passing a current between the junctions $A_3$ and $A_4$, junction $A_4$ being directly and continuously connected to one of said current supply leads, and a fifth MOS transistor $T_5$, which acts as a switch and has a gate which is connected to a clock voltage source which also timely applies the clock voltage for the intermittent energization of the sensor, a source and a drain;

a sixth ($T_6$) and a seventh ($T_7$) MOS transistor, each having a source, a drain and a gate, the drain of $T_6$ being connected to $A_1$ and the drain of $T_7$ being connected to $A_2$, while the sources of $T_6$ and $T_7$ are connected to the other of the current supply leads and the gates are connected to a clock voltage source for intermittently opening and closing the transistors $T_6$ and $T_7$;

the drain of $T_5$ being connected to the junction $A_3$ and the source of $T_5$ being directly and continuously connected to the other supply lead associated with $A_3$ and the gates of $T_5$, $T_6$ and $T_7$ being connected to said clock voltage sources which supply clock voltage in a manner such that at the beginning of each cycle the junctions $A_1$ and $A_2$ are first set to a rest voltage by closing the transistors $T_6$ and $T_7$, after which, while $T_5$ is opened, $T_6$ and $T_7$ are also opened and the signal charges to be read are supplied directly to the gates of $T_3$ and $T_4$, as a result of which a signal-dependent voltage difference is obtained between the junctions $A_1$ and $A_2$, whereupon the transistors $T_5$ is closed and said voltage difference is increased.

* * * * *

UNITED STATES PATENT AND TRADEMARK OFFICE
CERTIFICATE OF CORRECTION

PATENT NO. : 4,695,753

DATED : September 22, 1987

INVENTOR(S) : Marcellinus J.M. Pelgrom

It is certified that error appears in the above-identified patent and that said Letters Patent is hereby corrected as shown below:

Column 6, line 18, claim 1, change "rest" to --reset--.

Signed and Sealed this

Twenty-eighth Day of November 1989

Attest:

JEFFREY M. SAMUELS

Attesting Officer    Acting Commissioner of Patents and Trademarks